United States Patent
Sun et al.

[11] Patent Number: 6,078,111
[45] Date of Patent: Jun. 20, 2000

[54] PHOTOVOLTAIC OPTOELECTRONIC SWITCH

[75] Inventors: Chen-Kuo Sun, Escondido; Ching T. Chang, San Diego; Richard Nguyen, San Diego; Donald J. Albares, San Diego, all of Calif.

[73] Assignee: The United States of America as represented by the Secretary of the Navy, Washington, D.C.

[21] Appl. No.: 08/997,296

[22] Filed: Dec. 23, 1997

[51] Int. Cl.⁷ .................................................. H01H 35/00
[52] U.S. Cl. ................... 307/117; 250/200; 250/214 LS; 359/173
[58] Field of Search ..................... 359/189, 154, 359/173, 117; 307/117; 250/200, 214 R, 214 LS

[56] References Cited

U.S. PATENT DOCUMENTS

| | | |
|---|---|---|
| 4,123,673 | 10/1978 | Gonser . |
| 4,654,610 | 3/1987 | Dasilva . |
| 4,665,316 | 5/1987 | Hodges . |
| 4,712,020 | 12/1987 | Basile . |
| 4,825,081 | 4/1989 | Wille et al. . |
| 4,883,984 | 11/1989 | Kess . |
| 4,899,204 | 2/1990 | Rosen et al. . |
| 4,980,611 | 12/1990 | Orenstein . |
| 5,001,335 | 3/1991 | Takaoka et al. . |
| 5,072,189 | 12/1991 | Openlander . |
| 5,073,974 | 12/1991 | Nishimura . |
| 5,109,205 | 4/1992 | Hart et al. . |
| 5,146,075 | 9/1992 | Kim et al. . |
| 5,257,411 | 10/1993 | Minasi . |
| 5,367,310 | 11/1994 | Warnagiris ............................... 343/745 |
| 5,630,213 | 5/1997 | Vannatta . |

*Primary Examiner*—Kinfe-Michael Negash
*Attorney, Agent, or Firm*—Harvey Fendelman; Michael A. Kagan; Eric James Whitesell

[57] ABSTRACT

An optoelectronic switch for switching an input signal comprises two PIN diodes connected in series with opposed polarity, an input signal choke connected to the PIN diodes for presenting a high impedance to the input signal and a low impedance to a PIN diode bias, and a photovoltaic cell connected to the PIN diodes and the input signal choke for generating the PIN diode bias to switch the PIN diodes between a substantially conductive state while the photovoltaic cell receives optical energy from a light source and a substantially non-conductive state while the photovoltaic cell does not receive optical energy from the light source.

6 Claims, 1 Drawing Sheet

PHOTOVOLTAIC OPTOELECTRONIC SWITCH

BACKGROUND OF THE INVENTION

The present invention relates to an optically activated switch for high power RF signals. More specifically, but without limitation thereto, the present invention relates to photovoltaic switches having relatively low activation power.

Optically-activated RF switches include photoconductive switches, phototransistors, surface-depleted optical FET's, and photovoltaic field effect transistors. A photoconductive switch typically has an on-resistance that is linearly proportional to the power of the optical control signal, thus a low on-resistance of about 2 ohms typically requires an optical control signal power of over 50 mW. Switching time is generally linearly proportional to the carrier lifetime of the photoconductor and inversely proportional to the on-resistance. A high speed photoconductive switch thus tends to have the disadvantage of a high on-resistance. Phototransistors generally require high optical control power for a low on-resistance, and consequently suffer from the problem of a low off-resistance. The load resistance of a typical RF application, however, such as a dipole antenna, is approximately 73 ohms. An RF switch capable of switching a 100 W signal for such applications should have an off-resistance of at least 10 k ohms to adequately isolate the input from the output in the off state.

U.S. Pat. No. 4,712,020 issued on Dec. 8, 1987 to Basile discloses a single PIN diode as a switching element with photovoltaic cells in a bias circuit, but suffers the disadvantage of requiring a reverse bias dependent upon the input signal amplitude to switch the PIN diode to the off state (col. 4, ln. 21–24).

A need therefore exists for an RF switch having a low on-resistance, a high off-resistance, and no elecrical control signal power.

SUMMARY OF THE INVENTION

The optoelectronic switch of the present invention is directed to overcoming the problems described above, and may provide further related advantages. No embodiment of the present invention described herein should be construed to preclude other embodiments or advantages that may exist or become obvious to those skilled in the art.

An optoelectronic switch for switching an input signal of the present invention comprises two PIN diodes connected in series with opposed polarity, an input signal choke connected to the PIN diodes for presenting a high impedance to the input signal and a low impedance to a PIN diode bias, and a photovoltaic cell connected between the PIN diodes and the RF choke for generating the PIN diode bias to switch the PIN diodes between a substantially conductive state while the photovoltaic cell receives optical energy from a light source and a substantially non-conductive state the photovoltaic cell does not receive optical energy from the light source.

An advantage of the optoelectronic switch of the present invention is that low insertion loss and high isolation may be achieved with commercially available PIN diodes.

Another advantage is that the switched signal may be remotely located from the optical control source.

A further advantage is that no reverse bias need be supplied by the control circuit to turn the switch off.

Still another advantage of the optoelectronic switch is that the switched signal may be electrically, magnetically, and thermally isolated from the optical control source.

The features and advantages summarized above in addition to other aspects of the present invention will become more apparent from the description, presented in conjunction with the following drawings.

DESCRIPTION OF THE INVENTION

The following description is presented solely for the purpose of disclosing how the present invention may be made and used. The scope of the invention is defined by the claims.

Figure 1:
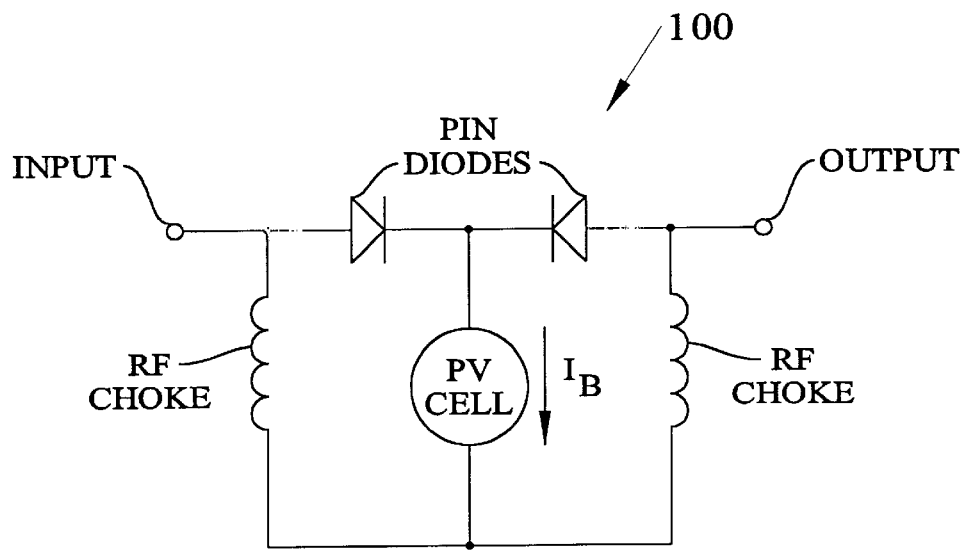
FIG. 1 is a diagram of an optoelectronic switch of the present invention.

FIG. 1 is a circuit diagram of an optoelectronic switch of the present invention comprising two PIN (P-type layer/Intrinsic layer/N-type layer) diodes connected in series with opposed polarity. RF or other signal frequency chokes are connected to the input and output ports of optoelectronic switch 100 to present a high impedance to the input signal and a low impedance to a bias current IB from the photovoltaic cell (PV CELL) in response to optical energy (not shown) incident on the photovoltaic cell. The optical energy may be supplied, for example, by a laser. In operation the optoelectronic switch is switched on while $I_B$ flows in response to incident optical energy and is switched off while $I_B$ ceases to flow in the absence of incident optical energy.

Figure 2:
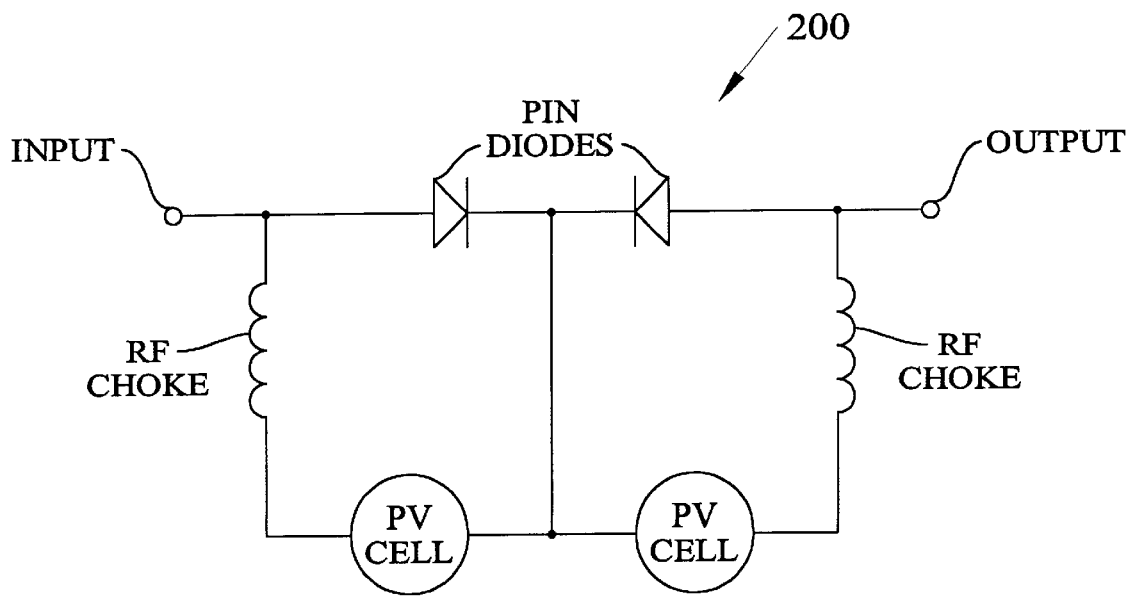
FIG. 2 is a alternative embodiment of the optoelectronic switch of the present invention with separate photovoltaic cells to bias the PIN diodes individually.

FIG. 2 is a alternate embodiment of an optoelectronic switch 200 using separate photovoltaic cells for biasing each PIN diode individually. Operation is similar to that of FIG. 1.

The optoelectronic switch of the present invention may be integrated in a package or on a circuit board as a vertical or lateral structure by methods well known in the art. Applications for the optoelectronic switch include switched frequency antennas, switched bandpass filters, and other switching functions.

Other modifications, variations, and applications of the present invention may be made in accordance with the above teachings other than as specifically described to practice the invention within the scope of the following claims.

We claim:

1. An optoelectronic switch comprising:

an input signal port and an output signal port;

at least two PIN diodes connected in series with opposed polarity and terminated at one end each by a PIN diode junction and at the opposite end each by the input signal port and the output signal port respectively;

a photovoltaic cell terminated at one end by the PIN diode junction for generating a PIN diode bias current to switch the PIN diodes between a substantially conductive state while the photovoltaic cell receives optical energy and a substantially non-conductive state while the photovoltaic cell does not receive optical energy;

an input signal choke terminated at one end by the input signal port and at its opposite end by an opposite end of the photovoltaic cell for presenting a high impedance to an input signal and a low impedance to the PIN diode bias current;

and an output signal choke terminated at one end by the output signal port and at its opposite end by the opposite end of the photovoltaic cell for presenting a high impedance to an output signal and a low impedance to the PIN diode bias current.

2. The optoelectronic switch of claim 1 further comprising a light source for providing the optical energy to the photovoltaic cell.

3. The optoelectronic switch of claim 2 further comprising an optical fiber coupling the light source to the photovoltaic cell.

4. The optoelectronic switch of claim 1 further comprising an additional photovoltaic cell connected to the PIN diodes for biasing each of the PIN diodes individually.

5. The optoelectronic switch of claim 1 further comprising an input signal source for providing the input signal.

6. An optoelectronic switch comprising:

an input signal port and an output signal port;

at least two PIN diodes connected in series with opposed polarity and terminated at one end each by a PIN diode junction and at an opposite end each by the input signal port and the output signal port respectively;

an input signal choke terminated at one end by the input signal port for presenting a high impedance to an input signal and a low impedance to an input PIN diode bias current;

a first photovoltaic cell terminated at one end by the PIN diode junction and at its opposite end by an opposite end of the input signal choke for generating the input PIN diode bias current to switch the input PIN diode between a substantially conductive state while the first photovoltaic cell receives optical energy and a substantially non-conductive state while the photovoltaic cell does not receive optical energy;

an output signal choke terminated at one end by the output signal port for presenting a low impedance to an output PIN diode bias current and a high impedance to an output signal;

and a second photovoltaic cell terminated at one end by an opposite end of the output signal choke and at an opposite end by the PIN diode junction for generating the output PIN diode bias current to switch the output PIN diode between a substantially conductive state while the second photovoltaic cell receives optical energy and a substantially non-conductive state while the photovoltaic cell does not receive optical energy.

\* \* \* \* \*